(12) United States Patent
Adachi

(10) Patent No.: US 6,624,454 B1
(45) Date of Patent: *Sep. 23, 2003

(54) SEMICONDUCTOR DEVICE HAVING A FLIP-CHIP CONSTRUCTION

(75) Inventor: Kazuhiko Adachi, Miyagi (JP)

(73) Assignee: Ricoh Company, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/074,078

(22) Filed: May 7, 1998

(30) Foreign Application Priority Data

May 12, 1997 (JP) .............................................. 9-137813

(51) Int. Cl.⁷ .............................................. H01L 29/80
(52) U.S. Cl. ....................................... 257/276; 257/728
(58) Field of Search ................................ 257/276, 698, 257/728; 331/99; 333/247; 438/108

(56) References Cited

U.S. PATENT DOCUMENTS

| 5,384,486 A | * | 1/1995 | Konno ........................ 257/752 |
| 5,768,109 A | * | 6/1998 | Gulick et al. ............... 361/794 |
| 5,903,239 A | * | 5/1999 | Takahashi et al. ... 343/700 MS |

FOREIGN PATENT DOCUMENTS

JP          8316368          11/1996

* cited by examiner

Primary Examiner—Douglas A. Willie
(74) Attorney, Agent, or Firm—Cooper & Dunham LLP

(57) ABSTRACT

A semiconductor device includes a mount substrate, a high-frequency transmission line provided on a top surface of the mount substrate, and a semiconductor chip mounted on the top surface of the mount substrate in a facedown state in electrical contact with the high-frequency transmission line, wherein there is formed a depression on the top surface of the mount substrate.

6 Claims, 6 Drawing Sheets

SEMICONDUCTOR DEVICE HAVING A FLIP-CHIP CONSTRUCTION

BACKGROUND OF THE INVENTION

The present invention generally relates to semiconductor devices and more particularly to a high-frequency semiconductor device operable in the GHz band, as well as the art of mounting such a high-frequency semiconductor device on a substrate to form a monolithic microwave integrated circuit (MMIC).

In relation to portable information processing apparatuses and systems including a portable telephone system known as PHS (personal handy-phone system), and further in relation to the construction of a radio LAN (local-area network) system, there is an increasing demand for semiconductor devices operable in the GHz band.

Generally, the semiconductor devices for use in such millimeter wave or microwave applications are formed of a MESFET or a HEMT, or alternatively an HBT, wherein such active devices are integrated with passive devices such as an MIM (metal-insulator-metal) capacitor or a spiral inductance to form an MMIC, together with a high-frequency transmission line such as a microstrip line provided on a common substrate on which the MMIC is to be formed.

FIG. 1 shows the typical construction of a conventional, general purpose semiconductor device.

Referring to FIG. 1, the semiconductor device includes a substrate 6 formed of a Si slab or a glass slab on which a ground plane 2, a dielectric layer 3 and a transmission line 5 are formed, wherein the substrate 6 further carries thereon a semiconductor chip 1 in a face-up state. Thereby, the transmission line 5 forms, together with the ground plane 2 and the intervening dielectric layer 3, a microstrip line, and electrode pads formed on the top surface of the semiconductor chip 1 are connected to the microstrip line 5 by corresponding bonding wires 4.

When the construction of FIG. 1 is to be used for the MMIC or a similar device for GHz applications, there arises a problem, associated with the use of the bonding wires 4 for interconnection between the semiconductor chip 1 and the microstrip line 5, in that the microwave signals propagating through the bonding wires 4 may be reflected back and forth due to the parasitic inductance of the bonding wire 4. Thereby, there can be a serious loss of the microwave signals.

In order to avoid the problem of parasitic inductance of the bonding wires, there is proposed a flip-chip mounting process in which the semiconductor chip is mounted upon a mount substrate, on which a microstrip line is formed, in a facedown state such that the electrode pads on the semiconductor chip is connected to the microstrip line directly, with a minimum distance. This process is also called an MBB (micro bump bonding) process. According to the flip-chip process, the bonding wires are eliminated and the parasitic inductance between the semiconductor chip and the microstrip line on the mount substrate is minimized successfully.

FIGS. 2A and 2B show the construction of an MMIC formed by the flip-chip process as proposed in the Laid-Open Japanese Patent Publication 08-316368, wherein those parts corresponding to the parts described previously are designated by the same reference numerals and the description thereof will be omitted. It should be noted that FIG. 2A shows the MMIC in the state before the flip-chip mounting process while FIG. 2B shows the same MMIC in the state after the flip-chip mounting process.

Referring to FIG. 2A, the ground plane 2 may be the layer of an Al—Si—Cu alloy formed on the substrate 6 with a thickness of about 1 $\mu$m. On the other hand, the dielectric layer 3 may be formed of an $SiO_2$ film having a thickness of about 20 $\mu$m. Further, the transmission line 5 may be formed of a layer of a conductive material such as Au formed with a thickness of typically 3–5 $\mu$m.

In the illustrated example, it should be noted that a bonding pad 51 is formed on the mount substrate 6 as a part of the transmission line 5, wherein the bonding pad 51 carries thereon a micro bump 53 for the MBB process of the semiconductor chip 1. In correspondence to the bonding pad 51, the semiconductor chip 1 carries, on the bottom surface thereof, a wiring pattern 9 and a bonding pad 52 corresponding to the bonding pad 51. It should be noted that the foregoing bottom surface of the semiconductor chip 1 is actually a top surface when the semiconductor chip 1 is in an ordinary, faceup state.

In the state of FIG. 2B, the foregoing semiconductor chip 1 is mounted upon the mount substrate 6 by the MBB process, wherein it should be noted that the bonding pad 51 of the microstrip line 5 and the corresponding bonding pad on the chip 1 are now connected with each other by the micro bump 53, and the micro bump 53 forms a rigid interconnection part 8. Typically, the micro bump 53 has a diameter of 10–20 $\mu$m and a height of several microns in the state of FIG. 2A before the mounting, while the micro bump 53 generally undergoes a lateral expansion in the state of FIG. 2B due to the mechanical deformation caused as a result of the mounting. As a result of such a mechanical deformation, the micro bump 53 typically has a diameter of several ten microns and a height of 1–2 $\mu$m in the state of FIG. 2B.

Thus, by using the flip-chip mounting process, the distance between the semiconductor chip 1 and the interconnection part 8 on the mount substrate 6 is reduced to 1–2 $\mu$m, and the problem of the parasitic inductance of the bonding wire as in the case of the construction of FIG. 1 is successfully eliminated.

On the other hand, there is a possibility in the flip-chip construction of FIGS. 2A and 2B in that the impedance of the wiring pattern 9 may be changed when the distance between the semiconductor chip 1 and the mount substrate 6 and hence the microstrip line 5, is reduced excessively as such. This problem may become particularly conspicuous in the case where there is provided a coplanar strip line on the bottom surface of the semiconductor chip 1 as the wiring pattern 9. In the case of a coplanar strip line, in which the electric field of the wiring pattern 9 is leaking toward the semiconductor chip 1, it is expected that the effect of the impedance change is more significant as compared with the case in which a microstrip line is formed on the semiconductor chip 1 as the wiring pattern 9.

It should be noted that a microstrip line conventionally formed on a semiconductor chip such as the semiconductor chip 1 for the wiring pattern 9 includes a ground plane provided on the rear surface (top surface in the illustrated state) of the semiconductor chip 1, and via holes are formed so as to penetrate through the semiconductor chip for connection to the ground plane. However, such a construction of the semiconductor chip 1 reduces the degree of freedom in designing the wiring pattern 9 substantially.

In the case of using a coplanar strip on the semiconductor chip 1, in which a ground pattern is provided adjacent to the wiring pattern used for carrying a high-frequency signal, it should be noted that such a construction requires an air bridge structure for interconnecting a pair of such ground patterns locating at both lateral sides of the wiring pattern at the part where the foregoing ground pattern pair form a single ground line intersecting the wiring pattern.

FIGS. 3A and 3B show an example of such an air bridge structure 7 respectively in a side view and a front view, wherein those parts corresponding to the parts described previously are designated by the same reference numerals and the description thereof will be omitted.

Referring to FIGS. 3A and 3B, the air bridge structure 7 is formed of a conductor material such as Au and has a thickness of 2–4 μm and a width of 20–30 μm, wherein the air bridge structure 7 bridges over a space 30 having a height of typically 3–5 μm and extends typically over a length of 50–80 μm. Thereby, the total amount of projection y of the air bridge structure 7 as measured in the downward direction from the bottom surface of the semiconductor chip 1 in the state of FIG. 2B becomes 5–9 μm, wherein it should be noted that the projection y is given as a sum of the height x of the space 30 and the thickness of the conductor strip forming the air bridge structure 7.

FIG. 4 shows a structure that would be needed for mounting a semiconductor chip carrying thereon a tall air bridge structure, on a mount substrate in the facedown state, wherein those parts corresponding to the parts described previously are designated by the same reference numerals and the description thereof will be omitted.

Referring to FIG. 4, the semiconductor chip 1 carrying thereon the air bridge structure 7 is flip-chip mounted in the inverted state, wherein it should be noted that the construction of FIG. 4 requires a substantial height x for the interconnection part 8, so that the problem of the air bridge structure 7 abutting to the top surface of the dielectric layer 3 is avoided. This, however, means that it is necessary to set the height x of the interconnection part 8 or micro bump to be comparable to or larger than the foregoing downward protrusion y of the air bridge structure 7, while such a construction increases the parasitic inductance of the interconnection part 8 and the advantageous feature of the flip-chip mounting process is lost substantially. Further, such a construction is unstable when the interconnection part 8 is to be formed by a solder bump.

Further, the foregoing conventional flip-chip construction of FIGS. 2A and 2B or FIG. 4 requires a high-precision positioning of the semiconductor chip 1 relative to the mount substrate 6, and it has been necessary to use an expensive alignment apparatus for the fabrication of the semiconductor device.

SUMMARY OF THE INVENTION

Accordingly, it is a general object of the present invention to provide a novel and useful semiconductor device wherein those parts corresponding to the parts described previously are eliminated.

Another object of the present invention is to provide a semiconductor device, comprising:
 a mount substrate;
 a high-frequency transmission line provided on a top surface of said mount substrate;
 a semiconductor chip mounted on said top surface of said mount substrate in a facedown state in electrical contact with said high-frequency transmission line, said semiconductor chip thereby having a bottom surface facing said top surface of said mount substrate; and
 a depression formed on said top surface of said mount substrate.

According to the present invention, the semiconductor chip is mounted in the facedown state on the mount substrate reliably and stably even in such a case in which the semiconductor chip carries thereon a protruding air bridge structure. Thereby, it is possible to form a coplanar strip line on the semiconductor chip as the high-frequency transmission line, by interconnecting the ground patterns provided on the semiconductor chip with a mutual isolation as a part of the coplanar strip line by way of the air bridge structure. The problem that the protruding air bridge structure abutting the top surface of the mount substrate is successfully avoided even when the semiconductor chip is mounted on the mount substrate in the facedown state, by forming the depression on the top surface of the mount substrate. By forming the depression on the top surface of the mount substrate as noted above, it is further possible to mount the semiconductor chip in the facedown state with a minimum height or thickness for the solder bump connecting the semiconductor chip with the high-frequency transmission line. Thereby, the inductance associated with the solder bump is successfully minimized.

Other objects and further features of the present invention will become apparent from the following detailed description when read in conjunction with the attached drawings.

DETAILED DESCRIPTION OF THE PREFERRED EMBODIMENTS

[First Embodiment]

Figure 5:
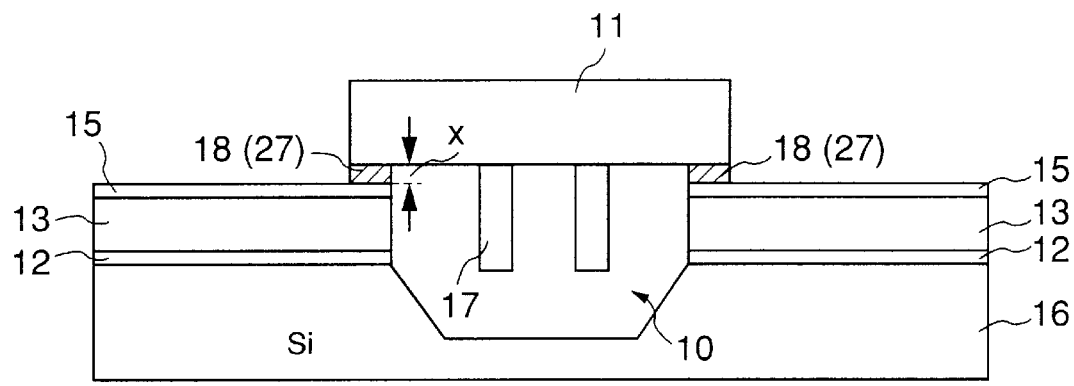
FIGS. 5 and 6 are diagrams showing the construction of a semiconductor device according to a first embodiment of the present invention.
Figure 6:
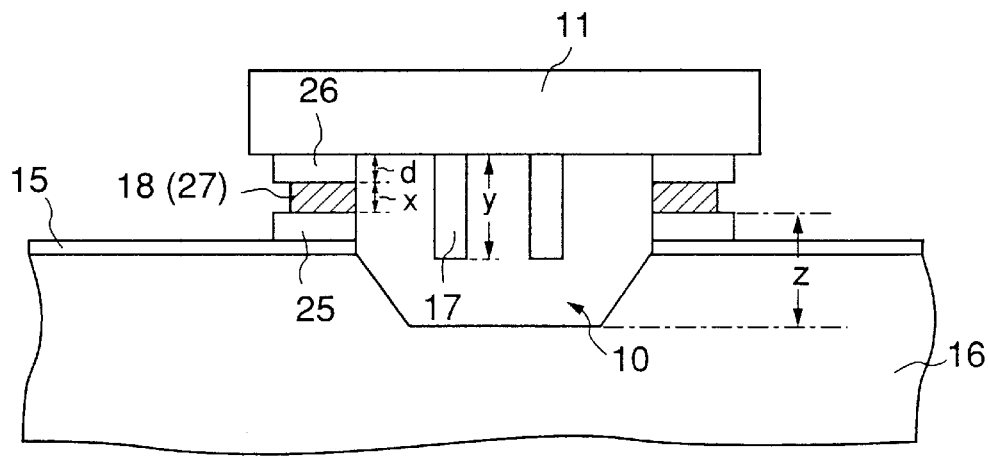

FIGS. 5 and 6 show the construction of a semiconductor device according to a first embodiment of the present invention respectively in a cross-sectional view and in a slightly detailed cross-sectional view.

Referring to FIGS. 5 and 6, the semiconductor device includes a mount substrate 16 typically formed of a Si slab or a glass slab carrying thereon a ground plane 12 formed of a conductor layer. The ground plane 12 forms a part of a microstrip line to be formed on the substrate 16 and carries thereon a dielectric layer 13 of $SiO_2$ and a conductor layer 15 forming a wiring pattern. The ground plane 12, the dielectric layer 13 and the wiring pattern 15 form together the microstrip line.

On the top surface of the substrate 16, there is formed a depression 10, and an opening is formed in the layers 12, 13 and 15 that form the microstrip line such that the depression 10 in the substrate 16 is exposed. Further, a semiconductor chip 11, which may be a GaAs MESFET or a HEMT or other suitable high-speed semiconductor device, is flip-chip mounted on the mount substrate 16 in correspondence to the depression 10. Thereby, the semiconductor chip 11 is interconnected to the wiring pattern 15 on the mount substrate 16 by way of a solder bump 27. The solder bump 27 thereby forms an interconnection part 18.

Referring to the detailed view of FIG. 6, it will be noted that the wiring pattern 15 carries a bonding pad 25 on a part thereof used for interconnection to the semiconductor chip 11.

It should be noted that the semiconductor chip 11 is the one that carries a coplanar strip line on the bottom surface of the chip. Thus, there is provided a bonding pad 26 on the bottom surface of the semiconductor chip 11 in electrical connection with a signal line that forms such a coplanar strip line, together with an adjacent ground pattern. As indicated in FIG. 6, the bonding pad 26 is electrically as well as mechanically connected to the foregoing bonding pad 25 on the top surface of the mount substrate 16 by the solder bump 27 that forms the interconnection part 18 as noted before. In FIG. 6, it should be noted that the illustration of the dielectric layer 13 and the ground plane 12 is omitted merely for the sake of simplicity of illustration.

Figure 3A:
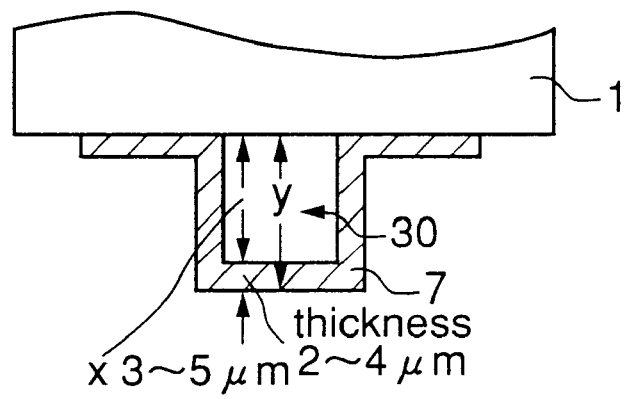
FIGS. 3A and 3B are diagrams showing an air bridge structure formed on a semiconductor chip.
Figure 3B:
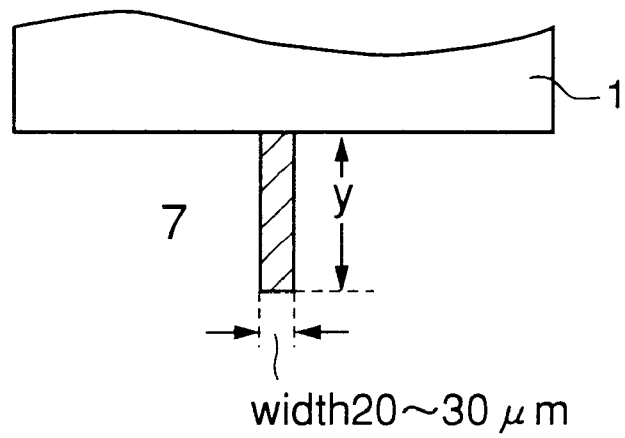

It should be noted that the ground pattern forming the coplanar strip line together with the signal line on the bottom surface of the semiconductor chip 11 includes an air bridge structure 17 at the part where the ground pattern crosses over other pattern such as a signal line, wherein the air bridge structure 17 projects from the bottom surface of the semiconductor chip 11 by a distance y similarly to the air bridge structure 7 of FIGS. 3A and 3B. Thus, the air bridge structure 17 may be formed of a conductor pattern such as an Au pattern and typically has a width of 20–30 $\mu$m and a thickness of 2–4 $\mu$m.

In the present embodiment, the problem of such an air bridge structure 17 abutting with the mount substrate 16 when the semiconductor chip 11 is mounted on the mount substrate 16 in the facedown state, is effectively eliminated without increasing the height of the interconnection part 18, by forming the depression 10 and the opening continuing to the depression 10 on the mount substrate 16 including the microstrip line on the mount substrate 16 such that the depression 10 accommodates therein the air bridge structure 17. More specifically, the depression 10 is formed with a depth z as measured from the top surface of the interconnection pad 25 such that the net projection of the air bridge structure 17 as measured from the interface between the interconnection pad 25 and the solder bump 27, given by y−(x+d) where x is the thickness of the solder bump 27 and d is the thickness of the interconnection bump 26, does not exceed the depth z ($z \geq y-(x+d)$). Otherwise, the air bridge structure 17 would abut to the bottom of the depression 10.

Figure 1:
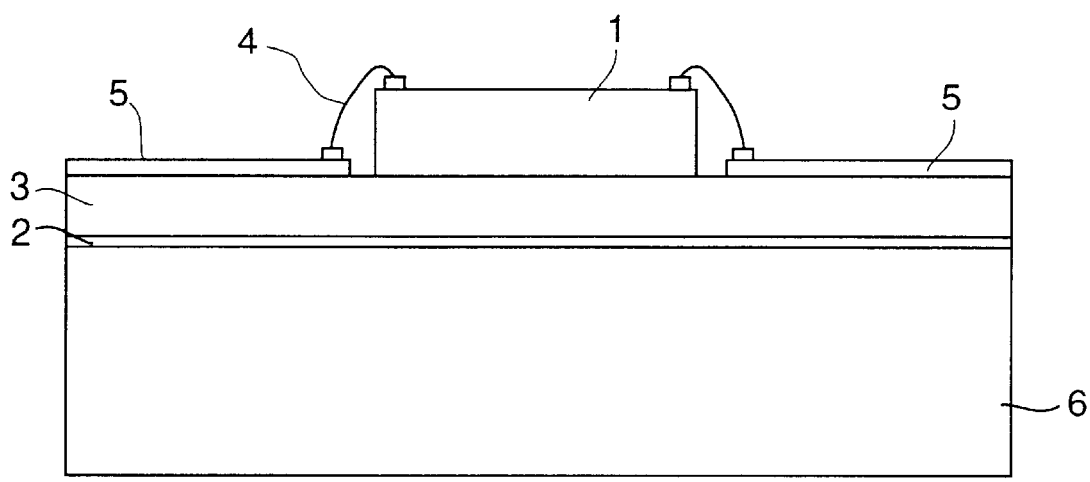
FIG. 1 is a diagram showing the construction of a conventional semiconductor device fabricated by a flip-chip process.
Figure 4:
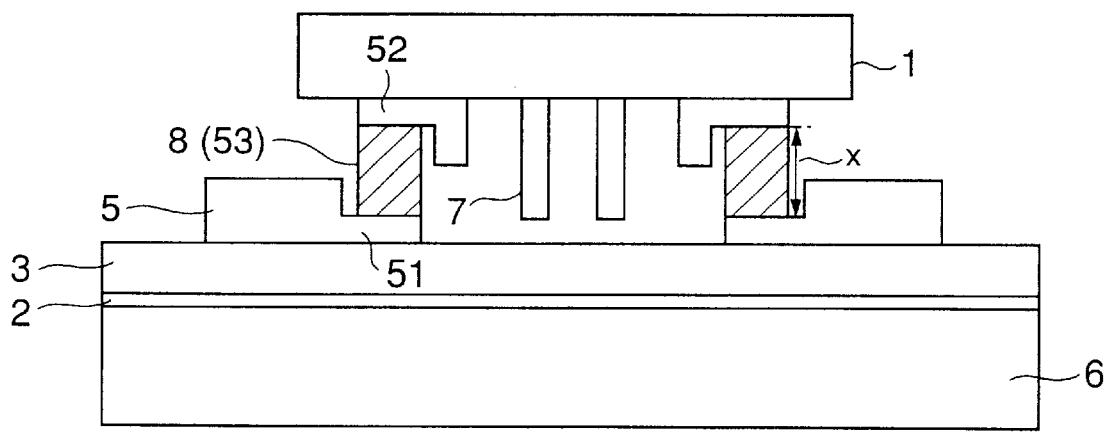
FIG. 4 is a diagram explaining the problem of the conventional flip-chip process associated with the use of an air bridge structure on the semiconductor chip.
Figure 2A:
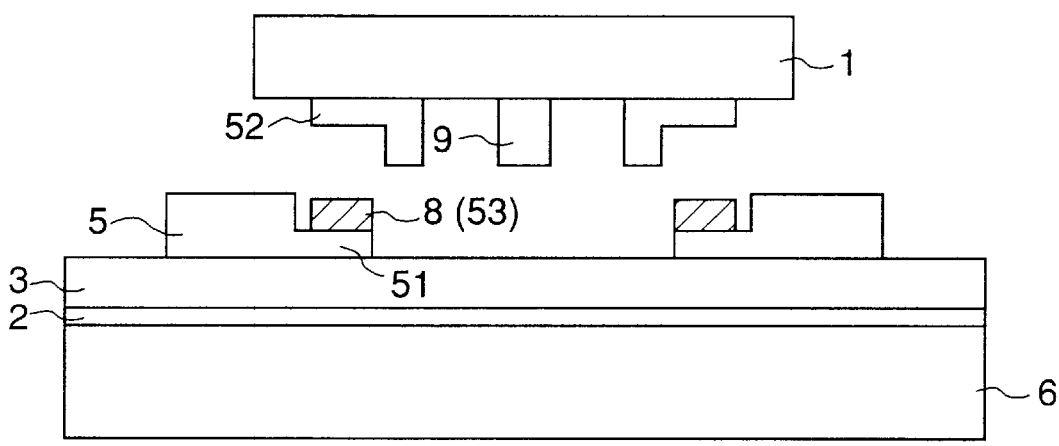
FIGS. 2A and 2B are diagrams showing a conventional flip-chip process for assembling a semiconductor device.
Figure 2B:
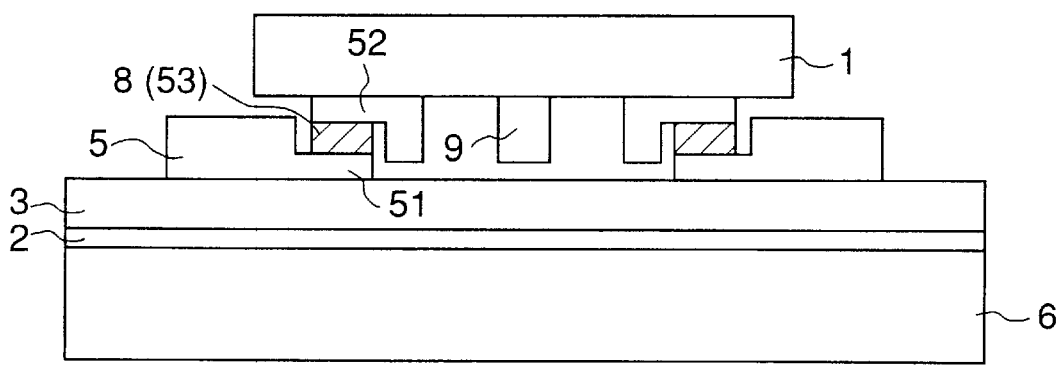

By increasing the depth z in correspondence to the height y, the foregoing inequality is met successfully, without increasing the thickness x of the solder bump 27 or the thickness d of the interconnection pad 26 on the semiconductor chip 11. When the depth z of the depression 10 is small or zero as in the conventional case shown in FIG. 4, it has been necessary to increase the thickness x of the solder bump 27 or the thickness d of the interconnection pad 26 for satisfying the foregoing inequality.

FIGS. 7A–7D show a fabrication process of the semiconductor device of FIGS. 5 and 6.

Figure 7A:
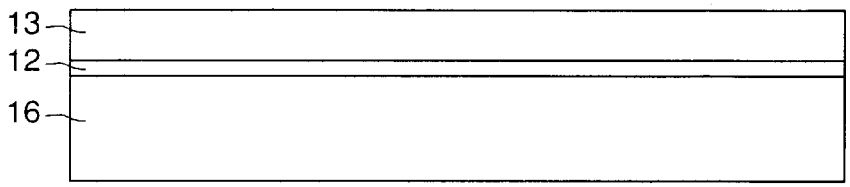
FIGS. 7A–7D are diagrams showing the fabrication process of a semiconductor device according to the first embodiment.

Referring to FIG. 7A, a Si substrate having an (100)-oriented principal surface is used for the mount substrate 16, and a layer of Al is deposited more or less uniformly on the substrate 16 by a sputtering process or other suitable deposition process as the ground plane 12 with a thickness of about 1 $\mu$m. Further, an $SiO_2$ film is deposited more or less uniformly on the ground plane 12 with a thickness of about 10 $\mu$m as the dielectric film 13.

Figure 7B:
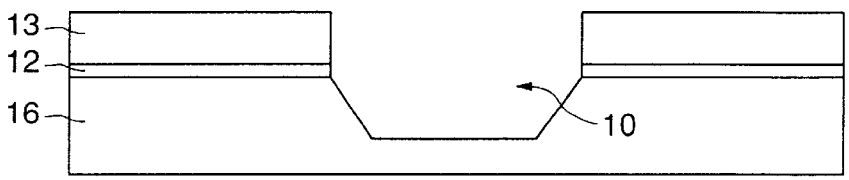

Next, in the step of FIG. 7B, a part of the dielectric film 13 is protected by a resist mask (not shown) and the part of the dielectric film 13 corresponding to the depression 10 of FIG. 5 is removed selectively by a wet etching process that uses HF for the etchant, followed by a wet etching process of the ground plane 12, wherein the etching process of the ground plane 12 may be conducted by using a mixture of $H_3PO_4$, $HNO_3$, $CH_3COOH$ and $H_2O$ when the ground plane 12 is formed of Al or an Al alloy.

After the surface of the Si substrate 16 is thus exposed as a result of the etching of the $SiO_2$ layer 13 and the ground plane 12, the resist mask is removed and the Si substrate 16 is subjected to a wet etching process conducted by using an alkaline etchant such as KOH, while using the $SiO_2$ layer 13 as a mask. Thereby, there occurs an anisotropic etching of Si in the Si substrate 16 and the depression 10 is formed such that the depression 10 is defined by a crystal surface of Si such as the (111) surface. The depth of the depression 10 is determined so as to satisfy the foregoing inequality corresponding to the condition that the air bridge structure 17 formed on the semiconductor chip 11 does not cause an interference with the bottom of the depression 10.

Figure 7C:
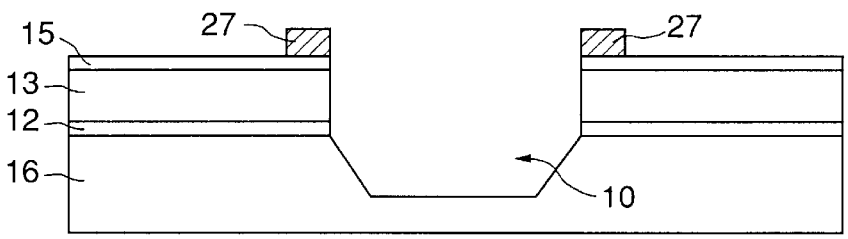
Figure 7D:
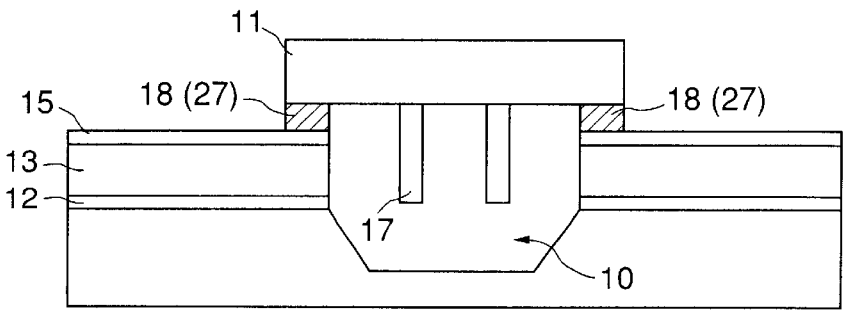

After the step of FIG. 7B, a step of FIG. 7C is conducted so as to form the wiring pattern 15, the interconnection pad 25 (see FIG. 6) and the solder bump 27 on the $SiO_2$ layer 13, and the semiconductor chip 11, carrying thereon the air bridge structure 17 is mounted on the substrate 16 in the facedown state in the step of FIG. 7D such that the air bridge structure 17 is accommodated into the foregoing depression 10. By causing a reflow in the solder bump 27 in the state of FIG. 7D, the semiconductor chip 11 is connected to the mount substrate 16 electrically as well as mechanically.

In the present embodiment, it should be noted that the depression 10 may be formed also by applying a dry etching process to the Si substrate 16 in the step of FIG. 7B. In such a case, the process of forming a corresponding opening in the dielectric layer 13 and in the ground plane 12 may also be conducted by a dry etching process. Further, it should be noted that the dielectric layer 13 may be formed of polyimide or SOG (spin-on-glass) in place of a $SiO_2$ film deposited by a process such as a CVD process or plasma CVD process.

The material for the substrate 16 is by no means limited to Si but alumina ($Al_2O_3$) may also be used. In this case, the depression 10 may be formed by a chemical etching process or physical process such as grinding.

As already noted, the present embodiment successfully eliminates the possibility of abutting of the air bridge structure on the semiconductor chip 11 with the mount substrate 16 by providing the depression 10 on the mount substrate 16 so as to satisfy the foregoing inequality.

In the step of FIG. 7C, it is also possible to form the solder bump 27 on the semiconductor chip 11.

[Second Embodiment]

Figure 8:
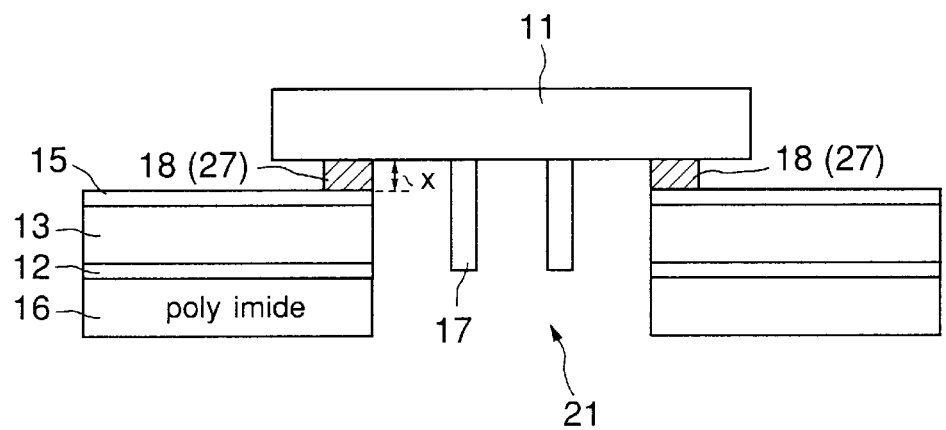
FIG. 8 is a diagram showing the construction of a semiconductor device according to a second embodiment of the present invention.

FIG. 8 is a diagram showing the construction of a semiconductor device according to a second embodiment of the present invention, wherein those parts corresponding to the parts described previously are designated by the same reference numerals and the description thereof will be omitted.

Referring to FIG. 8, it should be noted that the depression 10 formed in the construction of FIG. 5 is now replaced by a through-hole 21. Thereby, the air bridge structure 17 on the semiconductor chip 11 may have an arbitrary height as long as the air bridge structure 17 does not project beyond the bottom surface of the substrate 16.

In the present embodiment, it is preferable to form the dielectric layer 13 as well as the substrate 16 itself from polyimide. In this case, the through-hole 21 can be formed easily by a single dry etching process. Further, the construction of FIG. 8 is possible also in the case in which other dielectric material is used for the substrate 16 including Si.

[Third Embodiment]

Figure 9:
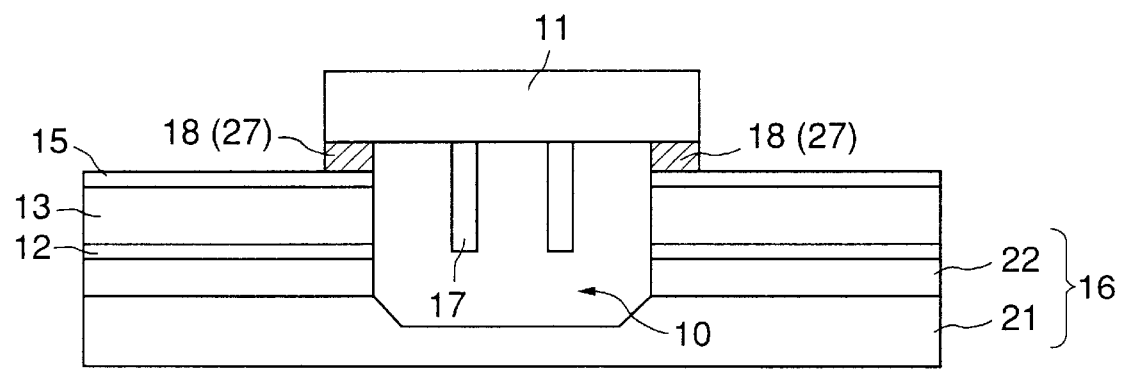
FIG. 9 is a diagram showing the construction of a semiconductor device according to a third embodiment of the present invention.

FIG. 9 shows a third embodiment of the present invention, wherein those parts corresponding to the parts described previously are designated by the same reference numerals and the description thereof will be omitted.

Referring to FIG. 9, the substrate 16 is formed of a lower layer 21 of Si and an upper layer 22 of $SiO_2$, wherein the upper layer 22 is formed of a through-hole in continuation with the through-holes formed in the layers 12 and 13 located thereabove. Thereby, the lower layer 21 of Si is formed with a depression corresponding to the depression 10.

By using such a two-layer or multilayer construction for the substrate 16, it is possible to use a low cost Si substrate having a problem in the purity and hence in the resistance, also for the lower layer 21. Similarly to the first embodiment explained with reference to FIG. 7B, the depression in the lower layer 21 is formed easily by an anisotropic wet etching process. While the materials for the lower layer 21 and the upper layer 22 are not limited to the combination of Si and $SiO_2$, it is preferable to use $SiO_2$ for the upper layer 22 and Si for the layer 21 in view of using the upper layer 22 as an etching mask in the step of forming the depression in the lower layer 21 by the anisotropic wet etching process.

Further, the present invention is applicable not only to the case in which the semiconductor chip 11 carries thereon a coplanar strip line but also to the case in which the semiconductor chip 11 carries thereon a projecting structure. Further, the present invention is applicable also to the case in which the semiconductor chip 11 carries thereon a microstrip line.

Further, the present invention is not limited to the embodiments described heretofore, but various variations and modifications may be made without departing from the scope of the invention.

what is claimed is:

1. A semiconductor device, comprising:

a support substrate formed of a Si slab;

a high-frequency transmission line structure provided on said support substrate, said high-frequency transmission line structure including a ground plane layer, a dielectric layer and a single layer of signal conductor patterns, said signal conductor patterns being provided and exposed at a top surface of the high-frequency transmission line structure;

a semiconductor chip mounted on said top surface in a facedown state in electrical contact with said high-frequency transmission line structure, said semiconductor chip thereby having a bottom surface facing said support substrate, said semiconductor chip carrying a coplanar strip line and an air bridge structure on said bottom surface;

a solder bump provided on said bottom surface of said semiconductor chip in electrical and mechanical contact with said high-frequency transmission line structure; and a depression formed in said support substrate through said high-frequency transmission line structure and into at least a portion of said support substrate, said depression being formed in correspondence to said semiconductor chip, a space formed between said bottom surface of said semiconductor chip and said signal conductor patterns, said depression having a depth z, as measured from a top surface of said high-frequency transmission line structure, determined so as to satisfy a relationship $z \geq y-(x+d)$, wherein y represents the height of said air bridge structure, x represents the height of said solder bump, and d represents the thickness of said coplanar strip line.

2. A semiconductor device as claimed in claim 1, wherein said high-frequency transmission line is a microstrip line including a ground layer, a dielectric layer provided on said ground layer and a wiring layer provided on said dielectric layer.

3. A semiconductor device as claimed in claim 2, wherein said dielectric layer is formed of $SiO_2$.

4. A semiconductor device as claimed in claim 2, wherein said dielectric layer is formed of polyimide.

5. A semiconductor device as claimed in claim 1, wherein said depression is defined by a side wall and a bottom surface, said side wall and bottom surface of said depression being formed of a crystal plane.

6. A semiconductor device as claimed in claim 1, wherein said support substrate comprises a glass slab.

* * * * *